United States Patent
Jawarani et al.

(10) Patent No.: US 7,521,314 B2
(45) Date of Patent: Apr. 21, 2009

(54) METHOD FOR SELECTIVE REMOVAL OF A LAYER

(75) Inventors: Dharmesh Jawarani, Round Rock, TX (US); Konstantin V. Loiko, Austin, TX (US); Andrew G. Nagy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 151 days.

(21) Appl. No.: 11/738,192

(22) Filed: Apr. 20, 2007

(65) Prior Publication Data

US 2008/0261385 A1    Oct. 23, 2008

(51) Int. Cl.
   *H01L 21/8238*  (2006.01)
   *H01L 21/336*   (2006.01)
   *H01L 21/4763*  (2006.01)

(52) U.S. Cl. .................... 438/230; 438/297; 438/303; 438/304; 438/595; 438/596; 257/E21.235; 257/E21.64

(58) Field of Classification Search .......... 257/E21.235, 257/E21.64

See application file for complete search history.

(56) References Cited

U.S. PATENT DOCUMENTS

| | | | |
|---|---|---|---|
| 7,399,690 B2 * | 11/2005 | Kwon | 438/595 |
| 7,361,973 B2 * | 4/2008 | Chidambarrao et al. | 257/623 |
| 2005/0064669 A1 * | 3/2005 | Orlowski et al. | 438/295 |
| 2006/0228863 A1 * | 10/2006 | Zhang et al. | 438/300 |
| 2008/0237726 A1 * | 10/2008 | Dyer | 257/369 |

OTHER PUBLICATIONS

J.R. Pfiester, L.C. Parrillo, M. Woo, H. Kawasaki, B. Boeck, E. Travis, and C. Gunderson, "An Integrated 0.5um CMOS Disposable TiN LDD/Salicide Spacer Technology" IEEE, 1989, pp. 32.5.1-32.5.4.

James R. Pfiester, "LDD Mosfet's Using Disposable Sidewall Spacer Technology", IEEE Electron Device Letters, vol. 9, No. 3, Apr. 1988, pp. 189-192.

X. Chen, S. Fang, W. Gao, T. Dyer, Y.W. Teh, S.S. Tan, Y. Ko, C. Baiocco, A. Ajmera, J. Park, J. Kim, R. Stierstorfer, D. Chidambarrao, Z. Luo, N. Nivo, P. Nguyen, J. Yuan, S. Panda, O. Kwon, N. Edleman, T. Tjoa, J. Widodo, M. Belyansky, M. Sherony, R. Amos, H. Ng, M. Hierlemann, D. Coolbough, A. Steegen, I. Yang, J. Sudijono, T. Schiml, J.H. Ku, C. Davis, "Stress Proximity Technique for Performance Improvement with Dual Stress Liner at 45nm Technology and Beyond", 2006 Symposium on VLSI.

James R. Pfiester, "An Advanced 0.5-um CMOS Disposable TiN LDD/Salicide Spacer Process", IEEE Electron Device Letters, vol. 11, No. 7, Jul. 1990, pp. 318-320.

* cited by examiner

*Primary Examiner*—Walter L Lindsay, Jr.
*Assistant Examiner*—Mohsen Ahmadi
(74) *Attorney, Agent, or Firm*—David G. Dolezal; Ranjeev Singh (57) ABSTRACT

A method for forming a semiconductor device includes forming a liner over a semiconductor material including a control electrode. The method further includes forming a first spacer adjacent to the control electrode, wherein the first spacer has a first width. The method further includes implanting current electrode dopants. The method further includes removing the first spacer. The method further includes forming a second spacer adjacent the control electrode, wherein the second spacer has a second width and wherein the second width is less than the first width. The method further includes using the second spacer as a protective mask to selectively remove the liner. The method further includes forming a stressor layer overlying the control electrode and current electrode regions.

19 Claims, 6 Drawing Sheets

METHOD FOR SELECTIVE REMOVAL OF A LAYER

BACKGROUND OF THE INVENTION

1. Field of the Invention

This invention relates in general to semiconductor devices and more specifically to the selective removal of a layer in the manufacture of semiconductor devices.

2. Description of the Related Art

Sacrificial spacers may be utilized in forming integrated circuits. In one example, sacrificial spacers are utilized for selectively implanting dopants to form deep source/drain implant regions where the sacrificial spacers prevent the implantation of dopants from occurring in locations where source/drain extension regions are desired.

In one example of forming a sacrificial spacer, a dielectric liner or layer is typically formed over a wafer followed by the formation of a layer of spacer material. The spacer material is then etched with an anisotropic etch that is selective to the dielectric liner. One problem with removing such a dielectric liner is that the etchant used to remove it may also undercut the gate dielectric of the transistor.

What is desired is an improved technique for the removal of the dielectric layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
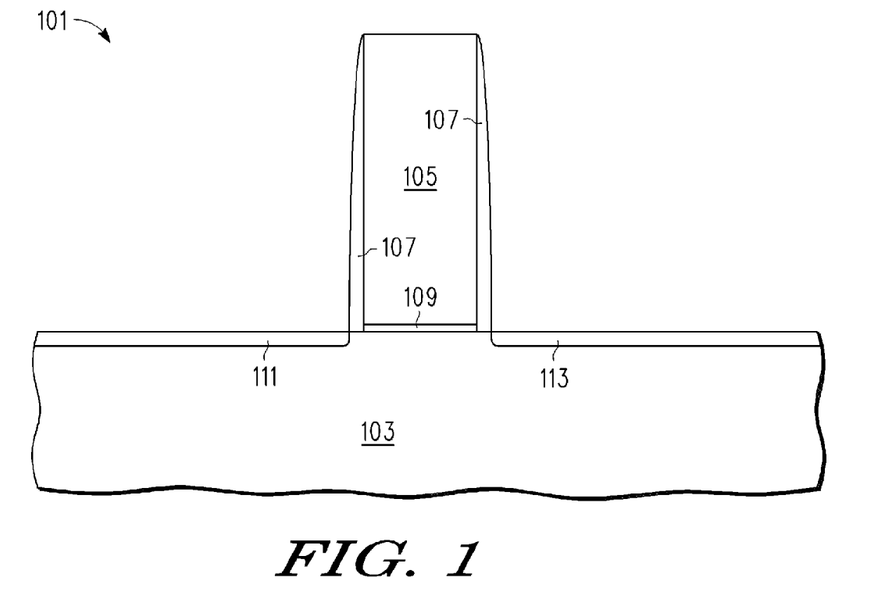
FIGS. 1-12 are partial cut away side views of a wafer during various stages in its manufacture according to one embodiment of the present invention.

FIG. 1 is a partial cut away side view of a wafer that is utilized for forming semiconductor devices. In the embodiment shown, wafer 101 includes a bulk semiconductor substrate 103 that is made of a semiconductor material (e.g. silicon, silicon germanium, gallium arsenide). In other embodiments, substrate 103 may have other configurations such as a semiconductor on insulator (SOI) configuration.

A gate 105 and gate dielectric layer 109 are formed over substrate 103 by forming a gate dielectric layer and layer of gate material over substrate 103 and patterning the layer of gate material to form a gate stack. In one embodiment, gate dielectric layer 109 is made of silicon oxide and is formed by thermal oxidation of substrate 103. In other embodiments, layer 109 may be deposited and/or may be made of other dielectric material (e.g. hafnium oxide). In one embodiment, gate dielectric layer 109 is approximately 15 Angstroms thick, but may be of other thicknesses in other embodiments.

In one embodiment, gate 105 is made of polysilicon, but may be made of other gate materials (e.g. metal or combinations thereof) in other embodiments. In one embodiment, gate 105 has a vertical thickness of 1000 Angstroms, but may have other thicknesses in other embodiments.

After gate 105 has been patterned, a sidewall spacer 107 is formed on the side wall of gate 105. In one embodiment, spacer 107 is formed by depositing a dielectric layer (e.g. silicon oxide) over wafer 101 followed by an anisotropic etching of that dielectric layer. In one embodiment, the layer for forming spacer 107 ranges from 60-80 Angstroms thick, but may be of other thicknesses in other embodiments.

After the formation of spacer 107, source/drain extension implant regions 111 and 113 are formed e.g. by the ion implantation of dopants (e.g. boron, arsenic, phosphorous) into substrate 103 outside gate 105 and spacer 107. In one embodiment, $BF_2$ ions are implanted at a dosage of $5e^{14}$ ions per $cm^2$ and at an energy of 3 Kev. In other embodiments, arsenic ions are implanted at a dosage of $1e^{15}$ ions per $cm^2$ and at an energy of 3 Kev. Other dosages and other energies may be used in other embodiments. In some embodiments, spacer 107 is not utilized.

Figure 2:
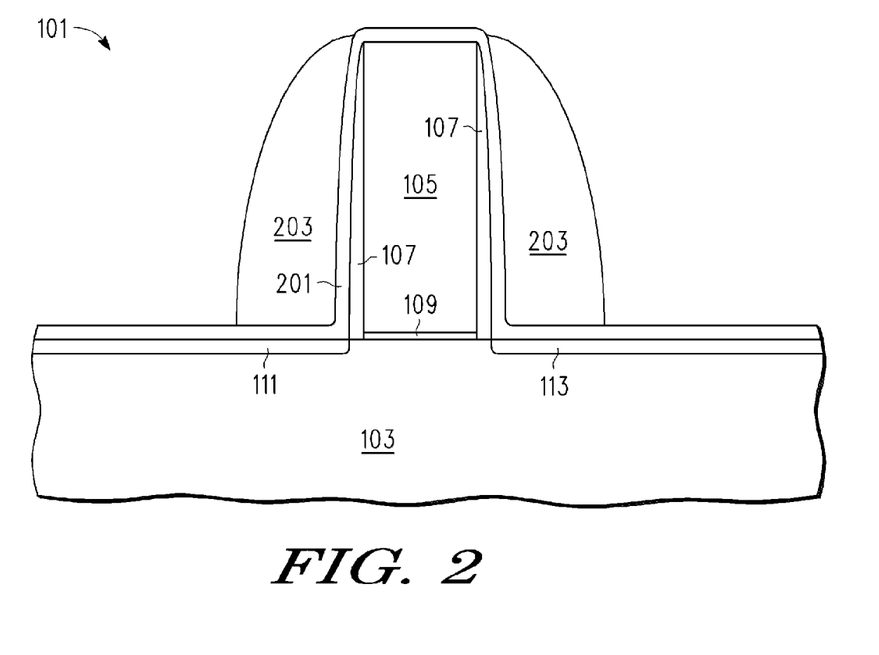

FIG. 2 shows wafer 101 after the formation of sacrificial spacer 203. In the embodiment shown, a liner 201 is formed over wafer 101 including over gate 105. In some embodiments, liner 201 has a thickness in the range of 100-200 angstroms but may be of other thicknesses in other embodiments. In one embodiment, liner 201 may be made of silicon dioxide or other dielectric materials.

Spacer 203 is formed by depositing a conformal material layer over liner 201 and subsequently dry anisotropically etching the layer with an etch chemistry that is selective to liner 201. Accordingly, liner 201 protects substrate 103 and gate 105 during the etching to form spacer 203. In one embodiment, spacer 203 is made of silicon nitride or titanium nitride. In other embodiments, spacer 203 can be made of any spacer material that is etch selective with respect to liner 201. In one embodiment, spacer 203 may be made from a spacer material layer that has a thickness in the range of 500-700 Angstroms, but may be of other thicknesses in other embodiments.

Figure 3:
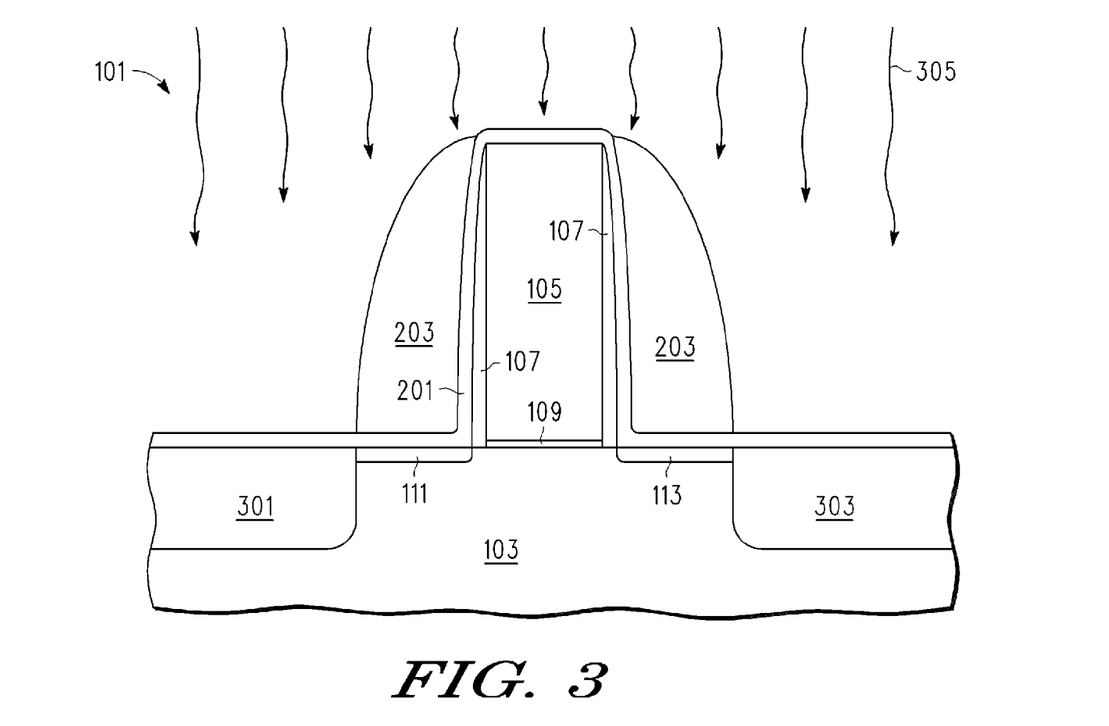

FIG. 3 shows wafer 101 during the implantation of ions to form deep source/drain regions 301 and 303. Deep source/drain regions 301 and 303 maybe formed by implanting dopant ions 305 (e.g. boron, arsenic, or phosphorous). In one embodiment, boron dopants are implanted at a dosage of $4.5e^{15}$ ions per $cm^2$ and at an energy of 5 Kev. In another embodiment, phosphorous ions are implanted at a dosage of $5.5e^{15}$ ions per $cm^2$ and at an energy of 9 Kev. But other energies and other doses may be used in other embodiments. In some embodiments, wafer 101 would be subsequently annealed (e.g. with a rapid thermal anneal or a spike anneal) to activate the dopants of regions 301, 111, 113, and 303.

Figure 4:
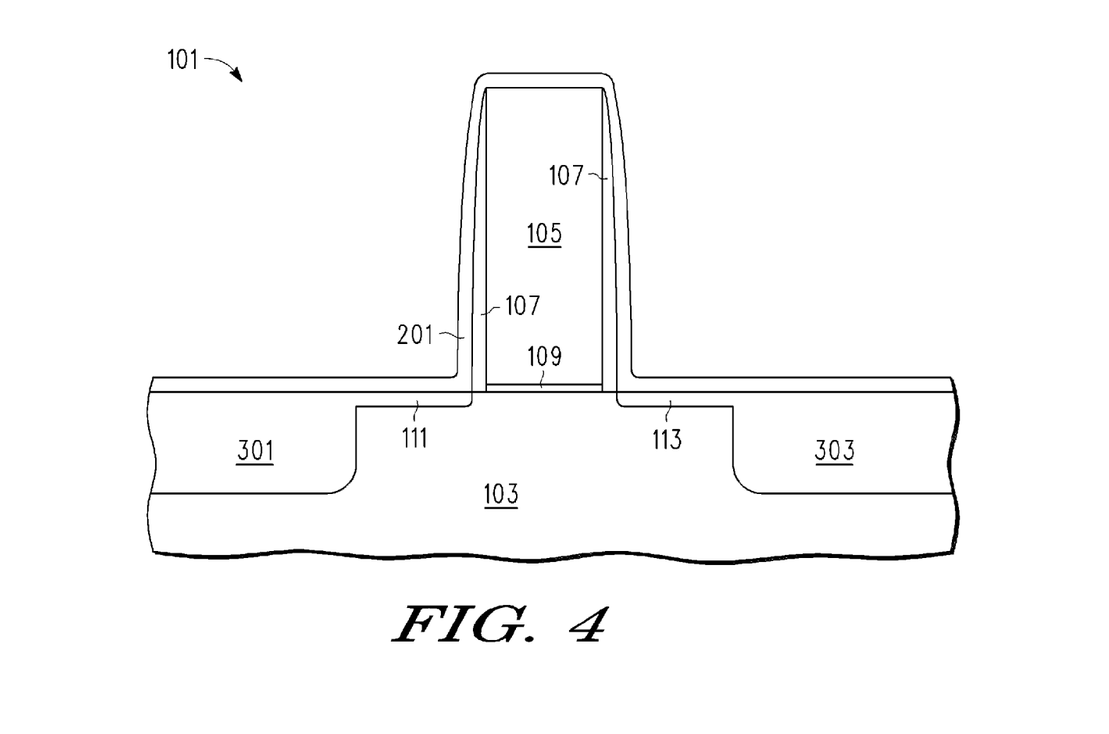

FIG. 4 shows a view of wafer 101 after sacrificial spacers 203 have been removed. In one embodiment, spacer 203 may be removed with an etch chemistry (e.g. hot phosphoric acid) that is selective to liner 201.

Figure 5:
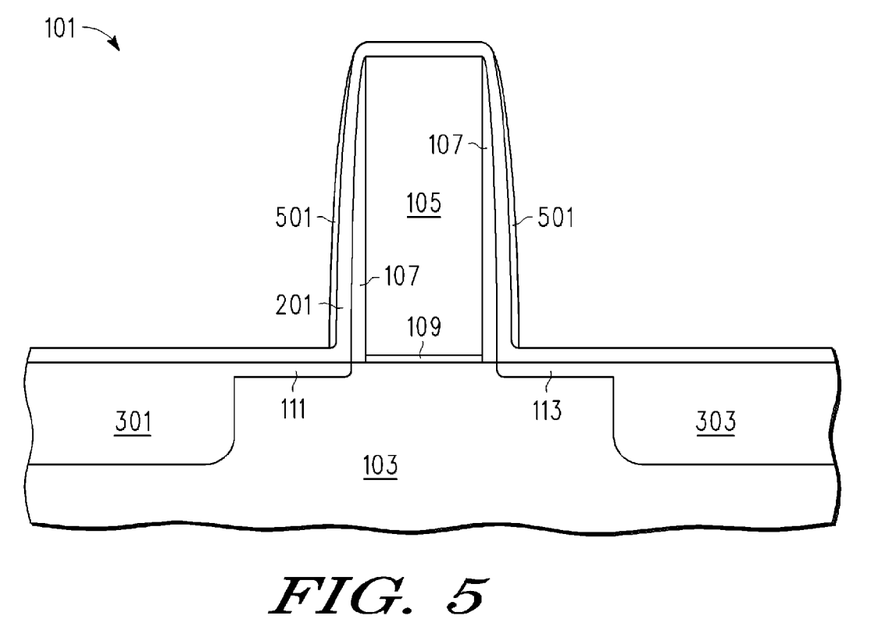

FIG. 5 shows wafer 101 after the formation of spacer 501 on liner 201. Spacer 501 is formed in one embodiment by the deposition of a conformal layer of spacer material over liner 201 and then followed by an anisotropic dry etch of that layer with an etch chemistry that is etch selective to the material of liner 201. In one embodiment where spacer 501 is made of titanium nitride and liner 201 is made of silicon dioxide, an etch chemistry of boron trichloride, chlorine, nitrogen, and argon may be used to form spacer 501. In other embodiments, spacer 501 may be made of other materials (e.g. silicon nitride). Also in other embodiments, other etch chemistries may be utilized. In one embodiment, the layer for forming spacer 501 has a thickness in the range of 30-50 Angstroms, but may have other thicknesses in other embodiments. In one embodiment, the layer may be formed by chemical vapor deposition (CVD) or by other deposition processes (e.g. physical vapor deposition (PVD)).

In some embodiments, spacer 501 maybe be formed at other stages in the processing of wafer 101. For example, spacer 501 maybe formed after the formation of liner 201 and before the formation of spacers 203. In such an embodiment, the layer of spacer material for forming spacer 203 would be formed over spacer 501.

Figure 6:
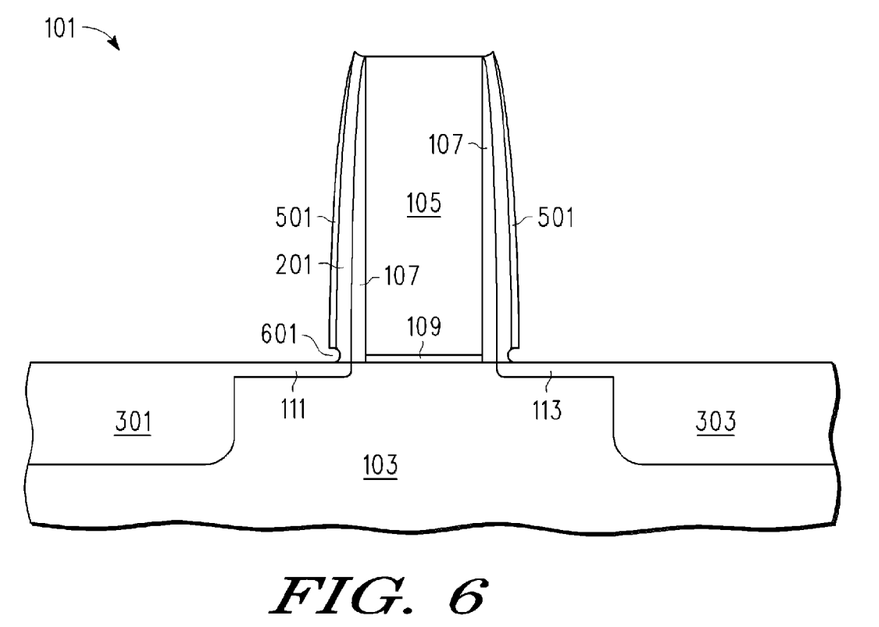

FIG. 6 shows wafer 101 after the removal of that portion of liner 201 that is not protected by spacer 501. In one embodiment, portions of liner 201 are removed by an etch chemistry (e.g. hydrofluoric acid) that is selective to the material of spacer 501 and the material of substrate 103. Removing liner 201 exposes substrate 103 at locations over the source/drain extension regions 111 and 113.

Because in some embodiments the etch chemistry has an isotropic component, the etchant forms a notch 601 underneath spacer 501. Utilizing spacer 501 during the etching of liner 201 helps to prevent the etchant from etching gate dielectric layer 109 beneath gate 105. Accordingly, in some embodiments, the thickness of spacer 501 may be varied to adjust for different thicknesses of liner 201 and for the isotropic characteristics of the etch chemistries to etch liner 201. In one embodiment, the thickness of spacer 501 is such that gate dielectric layer 109 is not exposed during the etching of liner 201.

Figure 7:
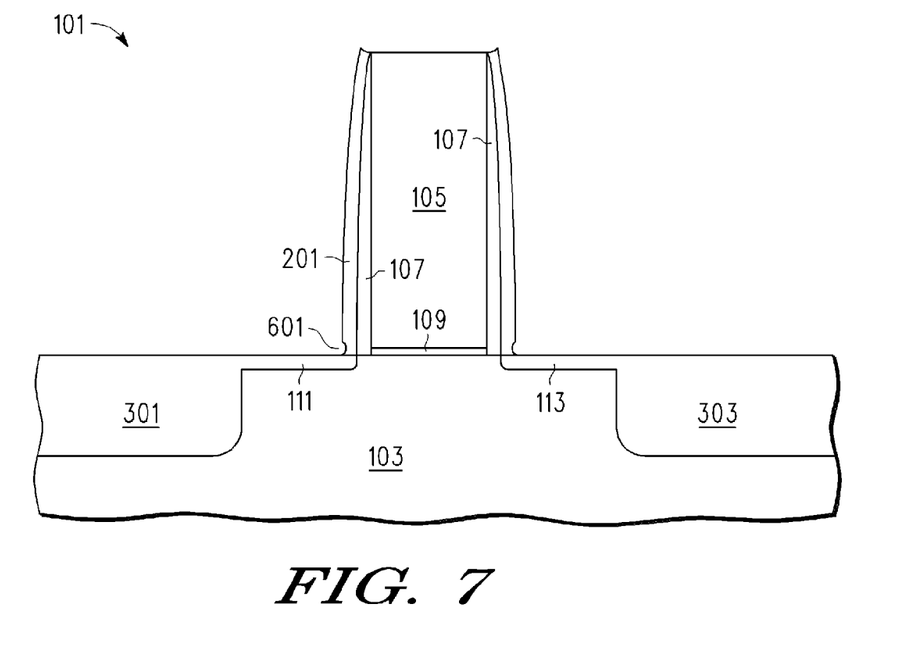

FIG. 7 shows wafer 101 after spacer 501 is removed. In one embodiment, spacer 501 is removed with a wet etch chemistry (e.g. sulfuric acid and hydrogen peroxide) that is selective to substrate 103, gate 105, and liner 201.

Figure 8:
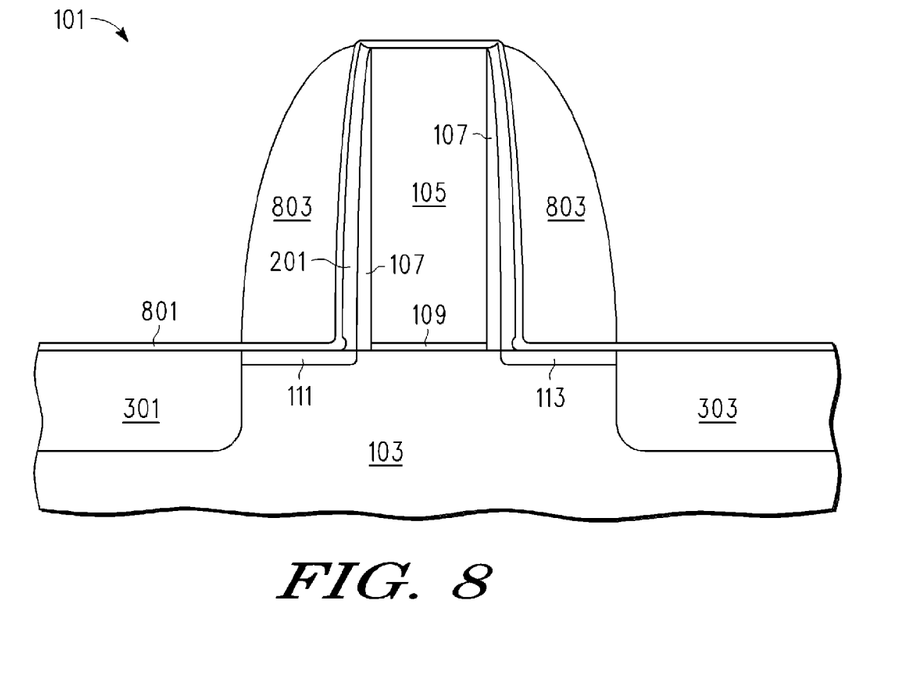

FIG. 8 shows wafer 101 after the formation of spacer 803 and a protective liner 801 formed underneath. In one embodiment, liner 801 is a layer of dielectric material (e.g. silicon dioxide). In one embodiment, liner 801 is 40 Angstroms thick, but may be of other thicknesses in other embodiments. In one embodiment, liner 801 is thinner than liner 201.

After the formation of liner 801, a conformal layer of spacer material (e.g. titanium nitride, silicon nitride) is formed on liner 801. The layer of spacer material is then anisotropically dry etched with an etchant that is selective to liner 801 to form spacers 803.

After the formation of spacer 803, the exposed portions of liner 801 are removed with an etch chemistry e.g. hydrogen fluoride that is selective to the material of spacer 803, gate 105, and substrate 103. The removal of liner 801 at locations outside of spacer 803 exposes substrate 103 and gate 105.

Figure 9:
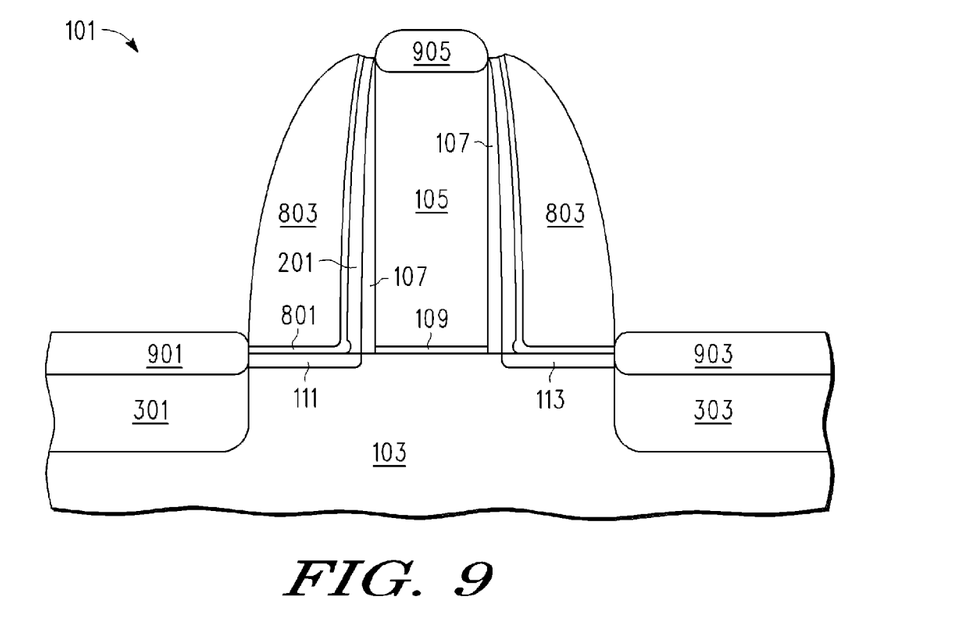

FIG. 9 shows wafer 101 after the formation of self aligned silicide 901 and 903 and silicide 905 on source/drain region 301, source/drain region 303, and gate 105, respectively. In one embodiment, silicide 901, 903, and 905 are formed by depositing a layer of metal (e.g. nickel) over wafer 101 and then heating the wafer (e.g. with a rapid thermal anneal) where the metal reacts with the exposed silicon in contact with the metal to form a silicide. In some embodiments, the unreacted metal would be removed followed by another heating step to further react the nickel and silicon of the silicide. Spacer 803 acts as a mask to prevent the formation of silicide over extension regions 111 and 113.

Figure 10:
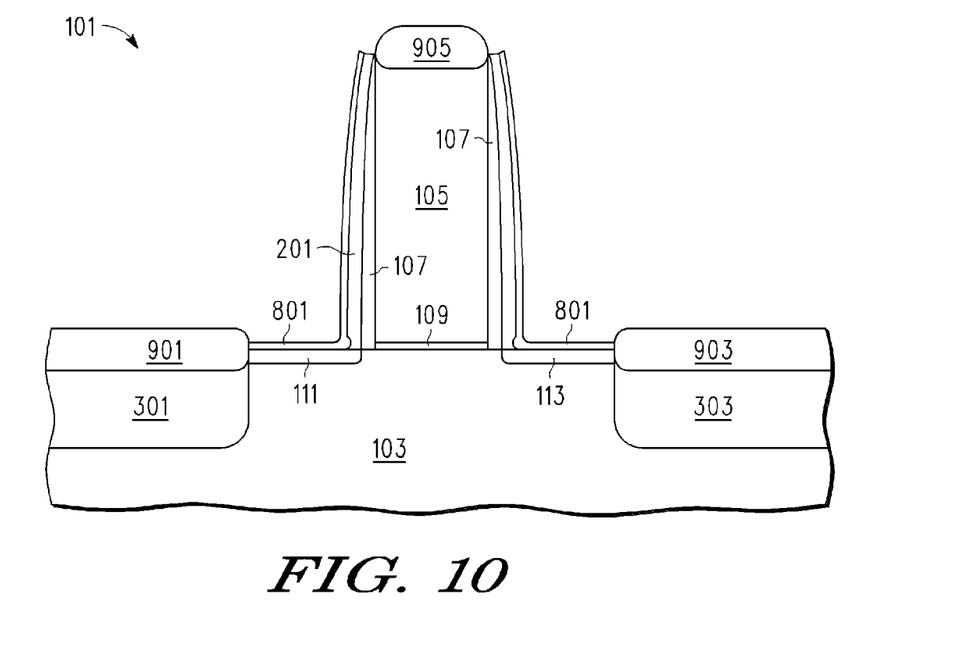

FIG. 10 shows wafer 101 after the removal of spacer 803. In one embodiment where spacer 803 is made of titanium nitride, spacer 803 is removed during the removal of the unreacted slicide metal (e.g. nickel). In one embodiment, spacer 803 is removed with an etch chemistry of sulfuric acid and hydrogen peroxide.

In other embodiments, spacer 501 would not be removed prior to the formation of spacer 803. Also in other embodiments, spacer 803 may be of a material such that liner 801 is not utilized. In some such embodiments, spacer 501 could be removed with the same etchant used to remove spacer 803. Also, in other embodiments, liner 801 may be grown by oxidizing exposed silicon of substrate 103 in ozonated water. In such an embodiment, spacer 501 may not be removed prior to the formation of spacer 803. Also in such an embodiment, spacer 501 could be removed with the etchant used to remove spacer 803.

Figure 11:
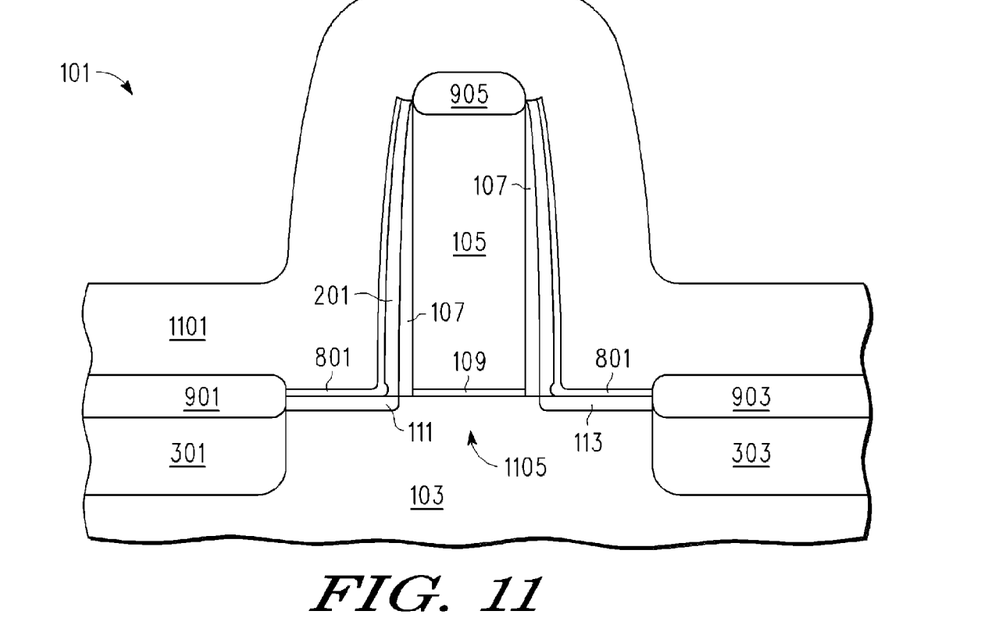

FIG. 11 shows wafer 101 after a stressor layer 1101 of stressor material is formed over wafer 101. Stressor layer 1101 is utilized to provide a stress on channel region 1105 of the transistor of gate 105. In one embodiment, stressor layer 1101 is made of silicon nitride and has certain properties for imparting a stress on surrounding structures. Layer 1101 may be made of other materials and/or have other properties in other embodiments.

In one embodiment, stressor layer 1101 serves as an etch stop layer for an etch of a subsequently formed dielectric layer.

Providing a stress on channel region 1105 may provide for improved carrier mobility of the transistor shown in FIG. 11. In some embodiments, layer 1101 provides a tensile stress on channel region 1105 to improve electron mobility for N-channel transistors. In other embodiments, layer 1101 provides a compressive stress on channel region 1105 to improve hole mobility in P-channel transistors. In one embodiment, a first type of stressor layer may be located over the N-channel transistors of a wafer and a second type of stressor layer may be located over the P-channel transistors of a wafer.

Utilizing spacer 501 as a protective mask to remove portions of liner 201 in areas adjacent to gate 105 without undercutting dielectric layer 109 allows stressor layer 1101 to be located as close as possible to channel region 1105. Locating layer 1101 as close as possible to channel region 1105 maximizes the effect of layer 1101 on channel region 1105. In the embodiments that utilize liner 801, liner 801 is relatively thin compared to liner 201, thereby allowing layer 1101 to be closer to channel region 1105.

Figure 12:
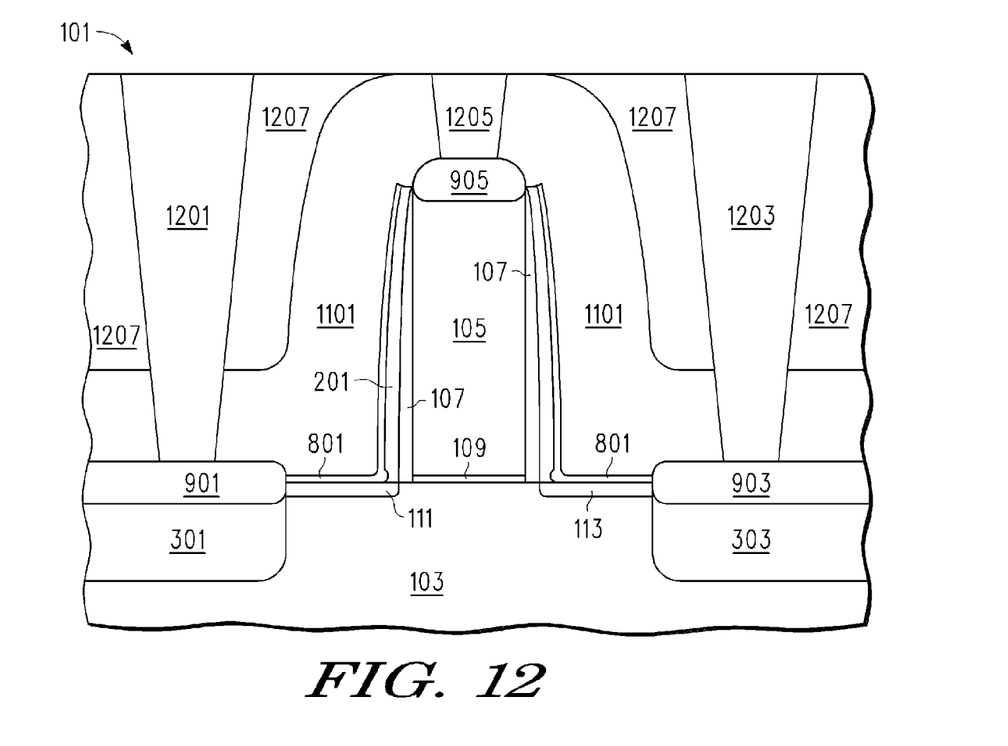

FIG. 12 shows wafer 101 after contacts 1201, 1203, and 1205 are formed to contact silicide 901, 903, and 905, respectively. In one embodiment, a layer 1207 of dielectric material is formed over stressor layer 1101 prior to forming contacts 1201, 1203, and 1205. Layer 1207 is then planarized and openings are formed in layer 1207 and layer 1101 to expose the silicide. The openings are filled with conductive material.

In subsequent processes, conductive interconnects and conductive vias within dielectric material are formed over wafer 101. External connectors (e.g. bond pads) may be formed on wafer 101. Afterwards, wafer 101 is singulated (e.g. with a saw) into multiple integrated circuits, each with one or more transistors similar to that shown in FIG. 12.

A gate is a control electrode for a field effect transistor. A source/drain region is a current electrode region for a field effect transistor. Although a field effect transistor is shown in FIG. 12, the processes described herein may be utilized in the manufacture of other types of transistors.

In one embodiment, a method for forming a semiconductor device includes forming a liner over a semiconductor material including over a control electrode and forming a first spacer adjacent to the control electrode. The first spacer has a first width. The method includes forming a first current electrode region and a second current electrode region, removing the first spacer, and forming a second spacer adjacent the control electrode. The second spacer has a second width and wherein the second width is less than the first width. The method also includes using the second spacer as a protective mask to selectively remove the liner and forming a stressor layer overlying the control electrode, the first current electrode region, and the second current electrode region.

In another embodiment, a method for forming a semiconductor device includes forming a liner over a semiconductor material including over a control electrode, forming a layer of spacer material overlying the liner, and anisotropically dry etching the layer of spacer material to form a first spacer adjacent the control electrode. The first spacer has a first width. The method also includes forming a first current electrode region and a second current electrode region in the semiconductor material, removing the first spacer, and forming a second spacer adjacent the control electrode. The second spacer has a second width, and the second width is less than the first width. The method also includes using the second spacer as a protective mask to selectively remove the liner and forming a third spacer adjacent the control electrode. The third spacer has a third width, and the third width is more than the second width. The method also includes removing the third spacer and forming a stressor layer overlying the control electrode, the first current electrode region, and the second current electrode region.

In another embodiment, a method for forming a semiconductor device includes forming a liner over a semiconductor material including a control electrode and forming a first spacer adjacent to the control electrode. The first spacer has a first width. The method also includes implanting current electrode dopants into a first region and a second region and after the implanting, removing the first spacer. The method includes forming a second spacer adjacent the control electrode. The second spacer has a second width and the second width is less than the first width. The second width is selected to ensure that a subsequent removal of the liner does not expose a region underlying the control electrode to an etching material. The method further includes using the second spacer as a protective mask to selectively remove the liner. The method further includes forming a stressor layer overlying the control electrode, the first region, and the second region.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a semiconductor device, comprising:
    forming a liner over a semiconductor material including over a control electrode;
    forming a first spacer adjacent to the control electrode, wherein the first spacer has a first width;
    forming a first current electrode region and a second current electrode region;
    removing the first spacer;
    forming a second spacer adjacent the control electrode, wherein the second spacer has a second width and wherein the second width is less than the first width;
    using the second spacer as a protective mask to selectively remove the liner; and
    forming a stressor layer overlying the control electrode, the first current electrode region, and the second current electrode region;
    wherein the second width is such that the selective removal of the liner does not expose a region underlying the control electrode to an etching material.

2. The method of claim 1, wherein the first spacer includes silicon nitride or titanium nitride, wherein the second spacer includes silicon nitride or titanium nitride.

3. The method of claim 1 further comprising forming a third spacer adjacent the control electrode, wherein the third spacer has a third width and wherein the third width is more than the second width.

4. The method of claim 3 further comprising forming a self-aligned silicide using the third spacer.

5. The method of claim 3 further comprising removing the second spacer prior to forming the third spacer.

6. The method of claim 1, wherein the step of forming the second spacer comprises:
    forming a layer of spacer material overlying the liner; and
    anisotropically dry etching the layer of spacer material.

7. The method of claim 1, wherein the step of forming the second spacer is performed after removing the first spacer.

8. The method of claim 1, wherein the step of forming the first spacer comprises:
    forming a layer of spacer material overlying the liner; and
    anisotropically dry etching the layer of spacer material with an etchant having an etch chemistry that is selective to the liner, wherein the liner protects the semiconductor material during the anisotropically dry etching.

9. The method of claim 1 wherein the forming the first current electrode region and the second current electrode region includes implanting dopants into the semiconductor material, wherein the first spacer inhibits the implantation of dopants into the semiconductor material located beneath the first spacer.

10. A method for forming a semiconductor device, comprising:
    forming a liner over a semiconductor material including over a control electrode;
    forming a layer of spacer material overlying the liner;
    anisotropically dry etching the layer of spacer material to form a first spacer adjacent the control electrode, wherein the first spacer has a first width;
    forming a first current electrode region and a second current electrode region in the semiconductor material;
    removing the first spacer;
    forming a second spacer adjacent the control electrode, wherein the second spacer has a second width and wherein the second width is less than the first width;
    using the second spacer as a protective mask to selectively remove the liner;
    forming a third spacer adjacent the control electrode, wherein the third spacer has a third width and wherein the third width is more than the second width;
    removing the third spacer; and
    forming a stressor layer overlying the control electrode, the first current electrode region, and the second current electrode region;
    wherein the second width is such that the using the second spacer as a protective mask to selectively remove the liner does not expose a region underlying the control electrode to an etching material.

11. The method of claim 10, wherein the first spacer includes silicon nitride or titanium nitride, wherein the second spacer includes silicon nitride or titanium nitride.

12. The method of claim 10 further comprising forming a self-aligned silicide using the third spacer.

13. The method of claim 10, wherein the step of forming the second spacer is performed after removing the first spacer.

14. The method of claim 10 further comprising removing the second spacer prior to forming the third spacer.

15. A method for forming a semiconductor device, comprising:
- forming a liner over a semiconductor material including over a control electrode;
- forming a first spacer adjacent to the control electrode, wherein the first spacer has a first width;
- implanting current electrode dopants into a first region and a second region;
- after the implanting, removing the first spacer;
- forming a second spacer adjacent the control electrode, wherein the second spacer has a second width and wherein the second width is less than the first width and wherein the second width is selected to ensure that a subsequent removal of the liner does not expose a region underlying the control electrode to an etching material;
- using the second spacer as a protective mask to selectively remove the liner; and
- forming a stressor layer overlying the control electrode, the first region, and the second region;
- wherein the step of forming the first spacer comprises:
  - forming a layer of spacer material overlying the liner; and
  - anisotropically dry etching the layer of spacer material with an etchant having an etch chemistry that is selective to the liner, wherein the liner protects the semiconductor material during the anisotropically dry etching.

16. The method of claim 15, wherein the first spacer includes silicon nitride or titanium nitride, wherein the second spacer includes silicon nitride or titanium nitride.

17. The method of claim 15 further comprising forming a third spacer adjacent the control electrode, wherein the third spacer has a third width and wherein the third width is more than the second width.

18. The method of claim 17 further comprising forming a self-aligned silicide using the third spacer.

19. The method of claim 15, wherein the step of forming the second spacer is performed after removing the first spacer.

* * * * *